(12) United States Patent
Gouko et al.

(10) Patent No.: US 9,553,250 B2
(45) Date of Patent: Jan. 24, 2017

(54) MANUFACTURING METHOD OF THERMOELECTRIC CONVERTER

(71) Applicant: DENSO CORPORATION, Kariya, Aichi-pref. (JP)

(72) Inventors: Norio Gouko, Kariya (JP); Atusi Sakaida, Kariya (JP); Toshihisa Taniguchi, Kariya (JP); Yoshihiko Shiraishi, Kariya (JP); Keiji Okamoto, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/031,559

(22) PCT Filed: Oct. 1, 2014

(86) PCT No.: PCT/JP2014/076254
§ 371 (c)(1),
(2) Date: Apr. 22, 2016

(87) PCT Pub. No.: WO2015/060082
PCT Pub. Date: Apr. 30, 2015

(65) Prior Publication Data
US 2016/0268493 A1   Sep. 15, 2016

(30) Foreign Application Priority Data
Oct. 25, 2013   (JP) ................................ 2013-222260

(51) Int. Cl.
*H01L 21/48*   (2006.01)
*H01L 35/34*   (2006.01)
(Continued)

(52) U.S. Cl.
CPC ......... *H01L 35/34* (2013.01); *H01L 21/02491* (2013.01); *H01L 21/02502* (2013.01); *H01L 21/486* (2013.01); *H01L 35/04* (2013.01)

(58) Field of Classification Search
CPC .................. H01L 21/02367; H01L 21/02428; H01L 21/02436; H01L 21/02496; H01L 21/4814; H01L 2021/60; H01L 2021/60277; H01L 2021/603
See application file for complete search history.

(56) References Cited

U.S. PATENT DOCUMENTS

2013/0218241 A1   8/2013   Savoy et al.
2015/0144171 A1   5/2015   Taniguchi et al.

FOREIGN PATENT DOCUMENTS

JP   2004165366 A   6/2004
JP   2009117792 A   5/2009
(Continued)

*Primary Examiner* — Cheung Lee
(74) *Attorney, Agent, or Firm* — Harness, Dickey & Pierce P.L.C.

(57) ABSTRACT

An insulating substrate to which intermediate portions or conductive pastes constituting the intermediate portions are disposed, a front surface protective member to which front surface patterns are formed, and a back surface protective member to which back surface patterns are formed are prepared. A laminated body, to which first end portions or conductive pastes constituting the first end portions are disposed between the intermediate portions or the conductive pastes constituting the intermediate portions and the front surface patterns, and second end portions or conductive pastes constituting the second end portions are disposed between the intermediate portions or the conductive pastes constituting the intermediate portions and the back surface patterns, is constituted. Then, thermoelectric conversion elements are formed by integrating the laminated body.

6 Claims, 5 Drawing Sheets

(51) Int. Cl.
*H01L 35/04* (2006.01)
*H01L 21/02* (2006.01)

(56) References Cited

FOREIGN PATENT DOCUMENTS

| JP | 2014007376 A | 1/2014 |
| JP | 2014007408 A | 1/2014 |
| JP | 2014007409 A | 1/2014 |

FIG.2
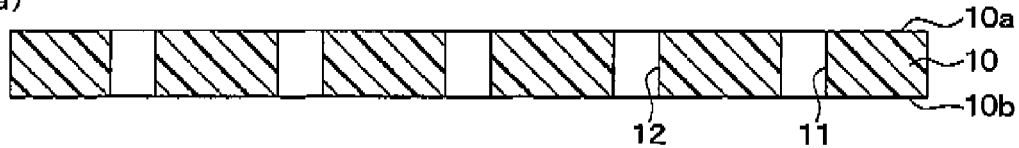
(a)
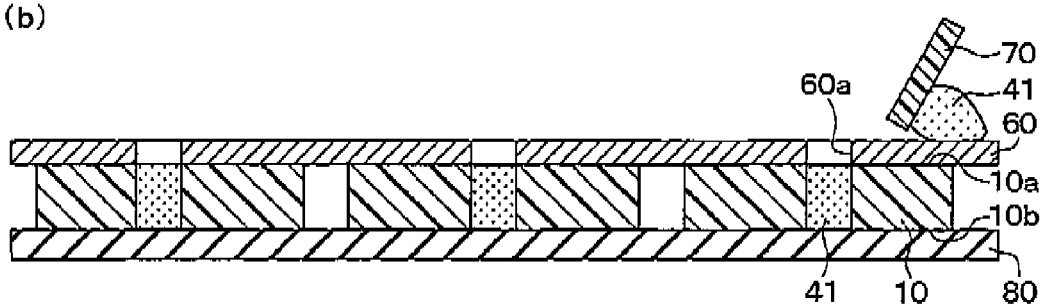
(b)
(c)
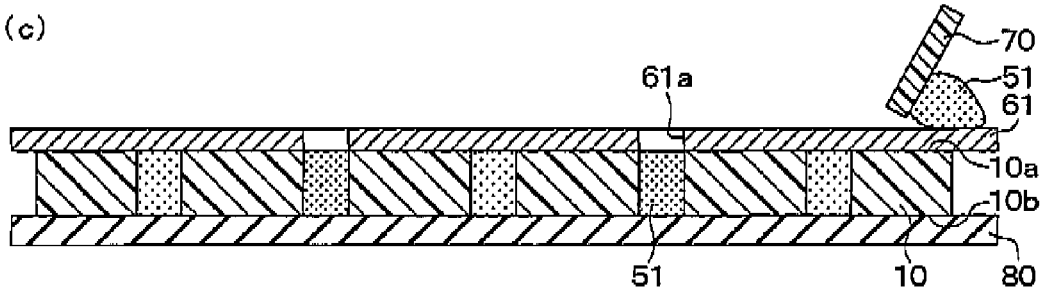
(d)
(e)
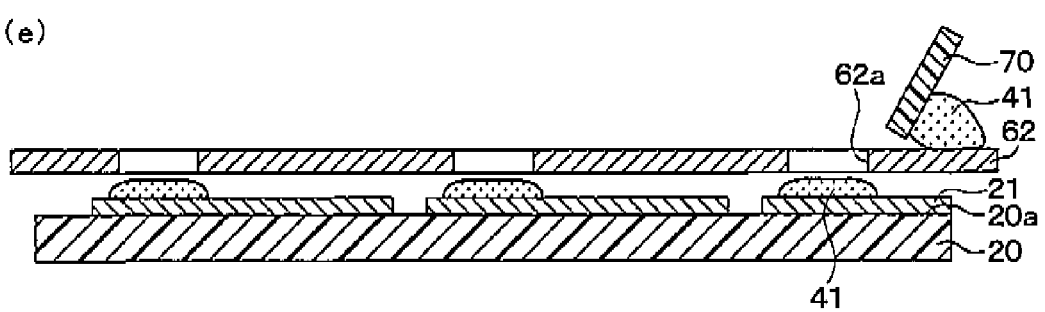
(f)
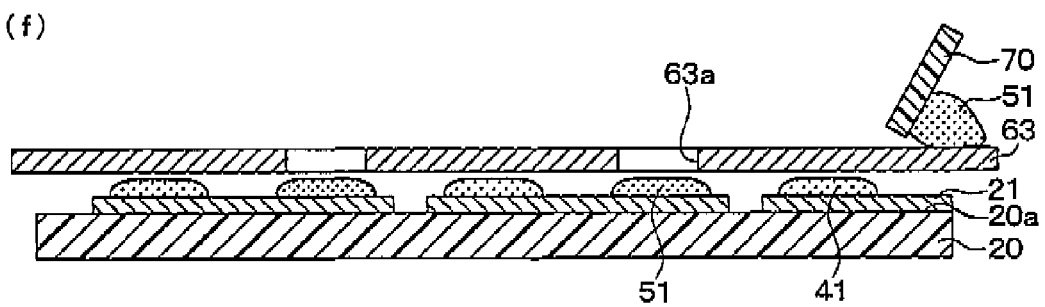

FIG.4
(a)
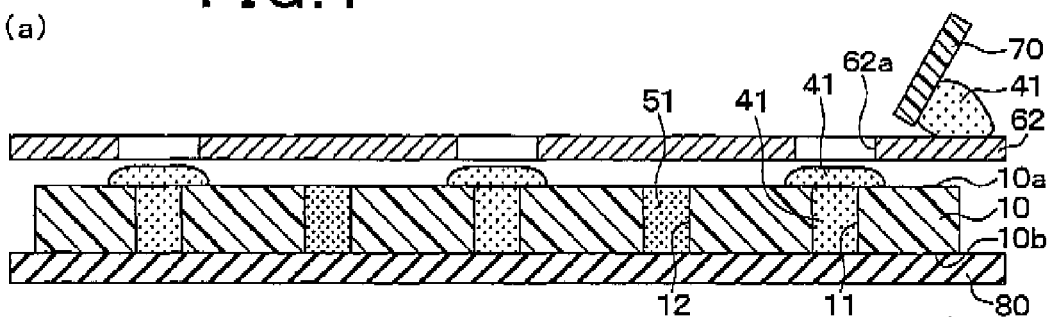
(b)
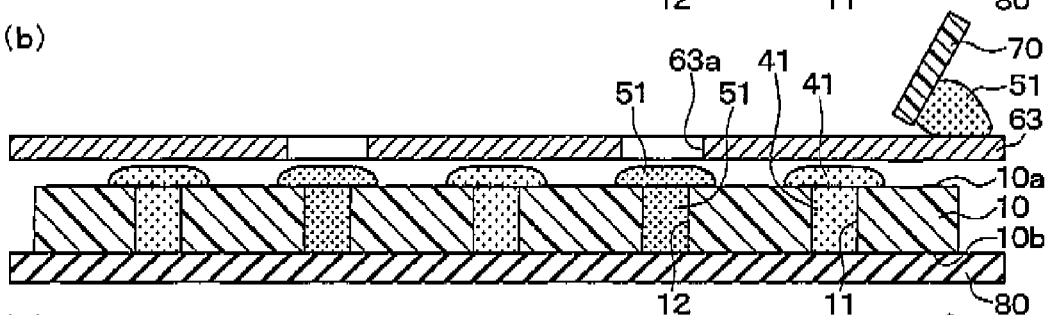
(c)
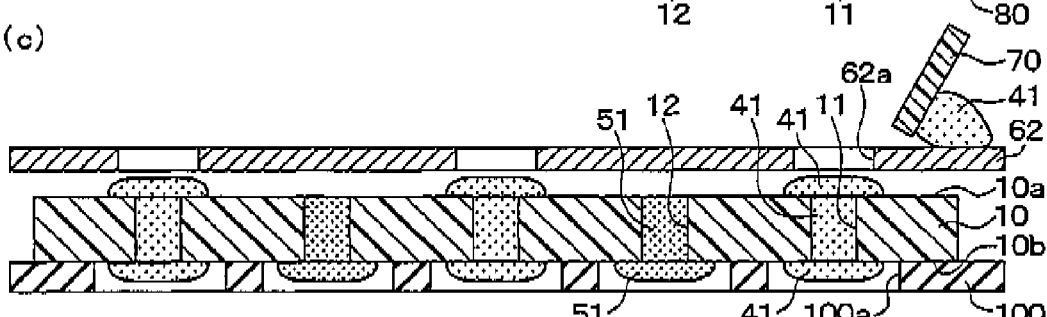
(d)
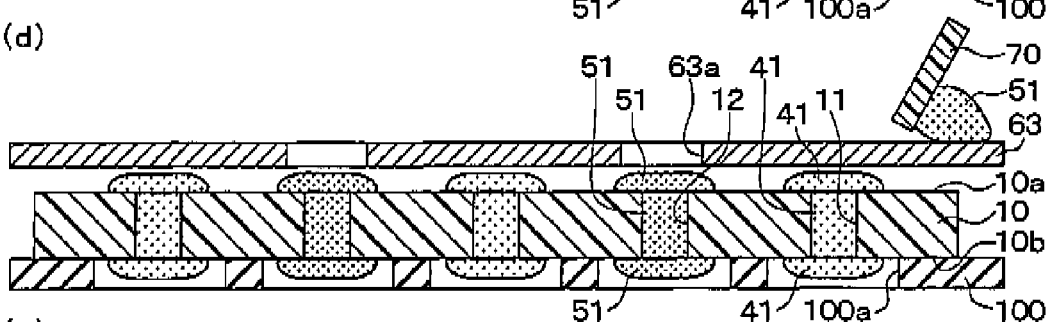
(e)
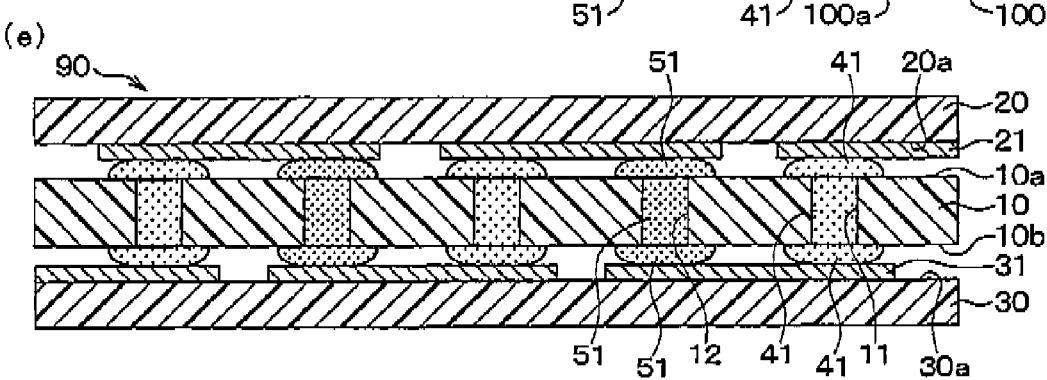

ature Patent Application Laid-Open Publication No. 2004-165366

MANUFACTURING METHOD OF THERMOELECTRIC CONVERTER

CROSS REFERENCE TO RELATED APPLICATIONS

This application is a U.S. National Phase Application under 35 U.S.C. 371 of International Application No. PCT/JP2014/076254 filed on Oct. 1, 2014 and published in Japanese as WO 2015/060082 A1 on Apr. 30, 2015. This application is based on and claims the benefit of priority from Japanese Patent Application No. 2013-222260 filed on Oct. 25, 2013. The entire disclosures of all of the above applications are incorporated herein by reference.

TECHNICAL FIELD

The present invention relates to a manufacturing method of a thermoelectric converter of which wiring patterns and thermoelectric conversion elements are connected.

BACKGROUND ART

Conventionally, a thermoelectric converter that has a plurality of thermoelectric conversion elements disposed between first and the second substrates disposed facing each other, and the plurality of thermoelectric conversion elements are connected with a front surface pattern formed on the first substrate and a back surface pattern formed on the second substrate has been proposed in a Patent Document 1, for example.

Specifically, among sectional areas of the thermoelectric conversion elements in the thermoelectric converter in a plane parallel to planes of the first and the second substrates, a sectional area of an end portion connected to the back surface pattern is configured to be larger than an area of an end portion connected to the front surface pattern and an area of an intermediate portion connecting the respective end portions.

According to this, effects of a thermoelectric conversion occurring at an interface between the back surface pattern and the thermoelectric conversion element can be increased as compared with a case where the thermoelectric conversion element is fixed to the sectional area of the intermediate portion. Further, a thermal resistance of the thermoelectric conversion element is suppressed from being reduced as compared with a case where the thermoelectric conversion element is fixed to the sectional area of the end portion of the back surface pattern side, and the temperature difference between the first and the second substrates can be suppressed from being reduced.

Such a thermoelectric converter is manufactured as follows. First, a thermoelectric conductor block is disposed on the second substrate to which the back surface pattern is formed. Thereafter, a plurality of thermoelectric conversion elements are formed by separating the thermoelectric conductor block from the second substrate side and an opposite side by using a dicing cutter or the like. At this time, a tapered cutter of which a width of a cutting portion is continuously narrowed from both sides toward a distal end is used as the dicing cutter. Thereby, when cutting the thermoelectric conductor block, the thermoelectric conversion element of which the sectional area of the end portion of the back surface pattern side is larger than the sectional area of the end portion of the front surface pattern side and the sectional area the intermediate portion side can be formed. Then, by disposing the first substrate to which the front surface pattern is formed on the opposite side of the second substrate to sandwich each thermoelectric conversion element, the thermoelectric converter is manufactured.

PRIOR ART

Patent Document

[Patent Document 1] Japanese Patent Application Laid-Open Publication No. 2004-165366

DISCLOSURE OF THE INVENTION

Problems to be Solved by the Invention

In recent years, in order to further enhance the effect of the thermoelectric conversion of the thermoelectric conversion element, in addition to the sectional area of the end portion connected to the back surface pattern, it is desired that the sectional area of the end portion connected with the front surface pattern be larger than the sectional area of the intermediate portion.

However, in the manufacturing method of the thermoelectric converter mentioned above, since the thermoelectric conversion elements are formed by separating the thermoelectric conductor block from the second substrate side and the opposite side by using the dicing cutter, it is difficult to form the sectional area of the end portion of the front surface pattern side larger than the sectional area of the intermediate portion.

The present invention has been made in light of the problems set forth above and has as its object to provide a manufacturing method of a thermoelectric converter having a thermoelectric conversion element of which sectional areas of an end portion connected to a front surface pattern and an end portion connected to a back surface pattern become larger than a sectional area of an intermediate portion that connects respective end portions.

Means for Solving the Problems

In order to achieve the object mentioned above, in a method for manufacturing a thermoelectric converter that has an insulated substrate to which a plurality of thermoelectric conversion elements are disposed, a surface protecting member is disposed on a front surface of the insulating substrate and formed with front surface patterns that are electrically connected to the predetermined thermoelectric conversion elements, and a back protective member disposed on a back surface opposite to the front surface of the insulating substrate and formed with back surface patterns that are electrically connected to the predetermined thermoelectric conversion elements, wherein each of the thermoelectric conversion elements has a first end portion connected to the front surface pattern, a second end portion connected to the back surface pattern, and an intermediate portion that connects the first end portion and the second end portion, and the thermoelectric conversion element of which sectional areas of the first and the second end portions in a direction parallel to a plane direction of the insulating substrate are configured to be larger than sectional areas of intermediate portions, it is characterized by the following points.

The method includes a process of preparing the insulating substrate to which a plurality of via holes penetrating through in a thickness direction are formed, and the intermediate portion or a conductive paste constituting the intermediate portion is disposed in the via holes, a process of preparing the front surface protective member to which the front surface patterns are formed, a process of preparing the back surface protective member to which the back surface patterns are formed, a process of constituting a laminated body by disposing the front surface protecting member on the front surface of the insulating substrate and disposing the back surface protective member on the back surface of the insulating substrate, and a process of integrating the laminated body, wherein, the first end portion or the conductive paste constituting the first end portion is disposed between the intermediate portion or the conductive paste constituting the intermediate portion and the front surface pattern, and the second end portion or the conductive paste constituting the second end portion is disposed between the intermediate portion or the conductive paste constituting the intermediate portion and the back surface pattern to constitute the laminated body in the process of constituting the laminated body, and the thermoelectric conversion element having the first and the second end portion and the intermediate portion is formed by applying pressure in a laminating direction while heating to the laminated body in the process of integrating the laminated body.

Further, the method includes a process of preparing the insulating substrate to which a plurality of via holes penetrating through in a thickness direction are formed, and the intermediate portion or a conductive paste so constituting the intermediate portion is disposed in the via holes, a process of preparing the front surface protective member to which the front surface patterns are formed, a process of constituting an intermediate constituent body by disposing the front surface protecting member on the front surface side of the insulating substrate, a process of integrating the intermediate constituent body, a process of preparing the back surface protective member to which the back surface patterns are formed, a process of constituting a laminated body by disposing the back surface protective member on the back surface of the insulating substrate, and a process of integrating the laminated body, wherein, the intermediate constituent body is constituted by disposing the first end portion or the conductive paste constituting the first end portion between the intermediate portion or the conductive paste constituting the intermediate portion and the front surface pattern in the process of constituting the intermediate constituent body, a part of the thermoelectric conversion element having the first end portion and the intermediate portion is formed by applying pressure in a lamination direction while heating to the intermediate constituent body in the process of integrating the intermediate constituent body, the second end portion or the conductive paste constituting the second end portion is disposed between the intermediate portion and the back surface pattern to constitute the laminated body in the process of constituting the laminated body, and the thermoelectric conversion element having the first and the second end portion and the intermediate portion is formed by applying pressure in a laminating direction while heating to the laminated body in the process of integrating the laminated body.

According to the inventions mentioned above, a thermoelectric converter having a thermoelectric conversion element of which sectional areas of first and second end portions in a direction parallel to a plane direction of an insulating substrate are configured to be larger than sectional areas of intermediate portions can be manufactured.

BRIEF DESCRIPTION OF THE DRAWINGS

FIGS. 2(a)-2(f) show a sectional view of a manufacturing process of the thermoelectric converter shown in FIG. 1;

FIGS. 4(a)-4(e) show a sectional view of a manufacturing process of the thermoelectric converter according to a second embodiment of the present invention.

MODE FOR CARRYING OUT THE INVENTION

Figure 1:
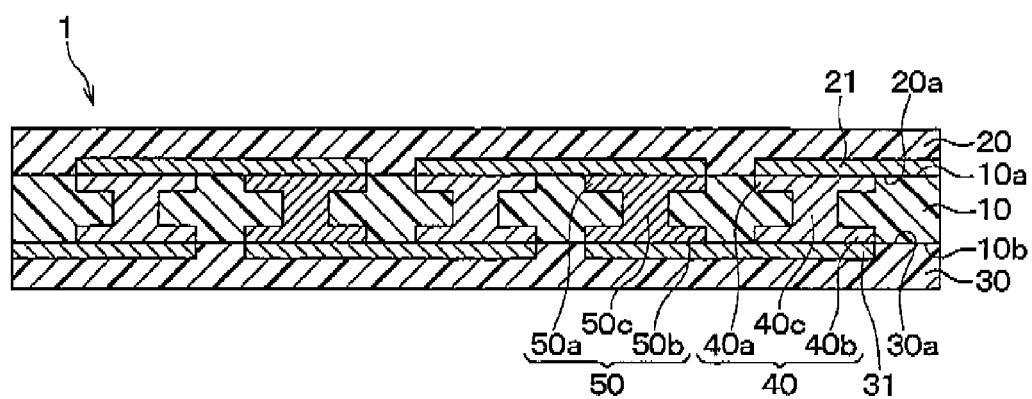
FIG. 1 shows a plan view of a thermoelectric converter according to a first embodiment of the present invention.

Hereinafter, embodiments of the present invention will be described with reference to the drawings. Note that in the following embodiments, portions identical or equivalent to each other will be given the same reference numerals for description.

First Embodiment

A first embodiment of the present invention will be described with reference to the drawings. As shown in FIG. 1, a thermoelectric converter 1 of the present embodiment is constituted by integrating an insulating substrate 10, a front surface protective member 20, and a back surface protective member 30, and first interlayer connection members 40 and second interlayer connection members 50, which are dissimilar metals, are connected alternately in series inside the integrated thermoelectric converter 1. Note that the first interlayer connection members 40 and the second interlayer connection members are equivalent to the thermoelectric conversion elements of the present invention in the present embodiment.

The insulating substrate 10 is constituted by a rectangular-plane shaped thermoplastic resin film including polyetheretherketone (PEEK) and polyetherimide (PEI) in the present embodiment.

Then, the first interlayer connection members 40, and the second interlayer connection members 50 that are the dissimilar metal to the first interlayer connection members 40 are disposed in the insulating substrate 10 so as to penetrate through the insulating substrate 10 in a thickness direction thereof. In the present embodiment, the first interlayer connection members 40 and the second interlayer connection members 50 are disposed in a zigzag grid-like pattern so as to alternate with each other.

Note that although not particularly limited, the first interlayer connection members 40 are composed of a solid-phase sintered metal compound (sintered alloy) so that a powder (metal particles) of Bi—Sb—Te alloy of a P-type layer maintains the same crystal structure of a plurality of metal atoms as before sintering, for example. Further, the metal second interlayer connection members 50 are composed of a solid-phase sintered metal compound (sintered alloy) so that a powder (metal particles) of Bi—Te alloy constituting an N-type layer maintains the same crystal structure of a plurality of metal atoms as before sintering.

A front surface protective member 20 constituted of a rectangular-plane shaped thermoplastic resin film including either polyetheretherketone (PEEK) or polyetherimide (PEI) is disposed on a front surface 10a of the insulating substrate 10. A planar shape of the front surface protecting member 20 has the same size as the insulating substrate member 10, and the front surface protecting member 20 is formed so that a plurality of front surface patterns 21 of copper foil or the like patterned on one surface 20a side that faces the insulating substrate 10 aew spaced apart from each other, and the front surface patterns 21 are connected to the first and the second interlayer connection members 40, 50.

Further, a back surface protective member 30 constituted of a rectangular-plane shaped thermoplastic resin film including either polyetheretherketone (PEEK) or polyetherimide (PEI) is disposed on a back surface 10b of the insulating substrate 10. A planar shape of the back surface protecting member 30 has the same size as the insulating substrate member 10, and the back surface protecting member 30 is formed so that a plurality of back surface patterns 31 of copper foil or the like patterned on one surface 30a side that faces the insulating substrate 10 are separated from each other, and the back surface patterns 31 are connected to the first and the second interlayer connection members 40, 50.

Note that the plurality of front surface patterns 21 and the back surface patterns 31 are electrically connected to the first and the second interlayer connection members 40, 50 suitably so that the first and the second interlayer connection members 40, 50 are connected alternately in series through the front surface patterns 21 and the back surface patterns 31.

Here, a configuration of the first and the second interlayer connection members 40, 50 of the present embodiment will be described specifically. The first and the second interlayer connection members 40, 50 include first end portions 40a, 50a connected with the front surface patterns 21, second end portions 40b, 50b connected with the back surface patterns 31, and intermediate portions 40c, 50c that connect the first and the second end portions 40a, 40b, 50a, 50b. In the first and the second interlayer connection members 40, 50, sectional areas of the first end portions 40a, 50a and the second end portions 40b, 50b in a direction parallel to a plane direction of the insulating substrate 10 are configured to be larger than sectional areas of the intermediate portions 40c, 50c. That is, the first and the second interlayer connection members 40, 50 have so-called I-shaped cross sections in a direction perpendicular to the plane direction of the insulating substrate 10.

Note that although not shown in detail, in another cross section as FIG. 1, contact portions that are electrically connected with the back surface patterns 31, and are exposed from one surface opposite to the insulating substrate 10 side of the back surface protective member 30 are formed in the back surface protective member 30. Then, external electrical connections are made by the contact portions.

The above is the configuration of the thermoelectric converter 1 in the present embodiment. In such a thermoelectric converter 1, in the first and the second interlayer connection members 40, 50, the sectional areas of the first end portions 40a, 50a and the second end portions 40b, 50b in the direction parallel to the plane direction of the insulating substrate 10 are configured to be larger than the sectional areas of the intermediate portions 40c, 50c. Therefore, effects of the thermoelectric conversion can be increased as compared with a case where the first and the second interlayer connection members 40, 50 are fixed to the sectional areas of the intermediate portions 40c, 50c. Further, a thermal resistance of the first and the second interlayer connection members 40, 50 is suppressed from being reduced as compared with a case where the first and the second interlayer connection members 40, 50 are fixed to the sectional areas of the first and the second end portions 40a, 40b, 50a, 50b. That is, the temperature difference between the front surface protective member 20 and the back surface protective member 30 can be suppressed from being reduced.

Next, a manufacturing method of the thermoelectric converter 1 will be described with reference to FIGS. 2 and 3.

First, as shown in FIG. 2(a), the insulating substrate 10 is prepared, and pluralities of cylindrical first and the second via holes 11, 12 are formed by drilling or the like. Note that the pluralities of the first and the second via holes 11, 12 are formed in a zigzag grid-like pattern so as to alternate with each other.

Next, as shown in FIG. 2(b), by a printing method using a mask 60 formed with a plurality of through holes 60a and a squeegee 70, a first conductive paste 41 is filled in the first via holes 11.

Specifically, first, an alloy metal powder in paste form in which metal atoms maintain a predetermined crystal structure with an addition of an organic solvent such as terpene having a melting point at room temperature as the first conductive paste 41 in the present embodiment. The alloy powder configuring the first conductive paste 41 that can be used includes, for example, a Bi—Sb—Te alloy or the like formed by mechanical alloying.

Then, the insulating substrate 10 is disposed such that the back surface 10b thereof faces an adsorption paper 80, and the mask 60 is disposed on the front surface 10a side of the insulating substrate 10. Thereafter, while melting the first conductive paste 41, the first conductive paste 41 is filled in the first via holes 11 through the through holes 60a.

Next, as shown in FIG. 2(c), by a printing method using a mask 61 formed with a plurality of through holes 61a and a squeegee 70, a second conductive paste 51 is filled in the second via holes 12.

Specifically, first, an alloy metal powder in paste form in which metal atoms different from metal atoms constituting the first conductive paste 41 maintain a predetermined crystal structure with an addition of an organic solvent such as terpene having a melting point at room temperature as the second conductive paste 51 in the present embodiment. The alloy powder configuring the second conductive paste 51 that can be used includes, for example, a Bi—Te alloy or the like formed by mechanical alloying.

Then, the mask 61 is disposed on the front surface 10a side of the insulating substrate 10, and while melting the second conductive paste 51, the second conductive paste 51 is filled in the second via holes 12 through the through holes 61a.

Note that the absorption paper 80 only needs to be a material that can absorb an organic solvent of the first and the second conductive pastes 41, 42, and thus generally used good quality paper or the like may be used. Further, the present embodiment uses terpene having the melting point at room temperature as the organic solvent contained in the first and the second conductive pastes 41, 51. Therefore, although the organic solvent evaporates when filling the first and the second conductive pastes 41, 51, it is possible to further remove the organic solvent from the first and the second conductive pastes 41, 52 by disposing the absorption paper 80. That is, the alloy powder contained in the first and the second conductive pastes 41, 51 can be disposed closely to the first and the second via holes 11, 12.

As described above, the insulating substrate 10 filled with the first and the second conductive pastes 41, 51 is prepared.

Further, in another process to the above process, as shown in FIG. 2(d), the copper foil or the like is formed on one surface 20a of the front surface protective member 20 that faces the insulating substrate 10. Then, by appropriately patterning the copper foil, the plurality of front surface patterns 21 that are spaced apart from each other are formed.

Thereafter, as shown in FIG. 2(*e*), by a printing method using a mask 62 formed with a plurality of through holes 62*a* and the squeegee 70, the first conductive paste is applied to predetermined positions on the front surface patterns 21.

Next, as shown in FIG. 2(*f*), by a printing method using a mask 63 formed with a plurality of through holes 63*a* and the squeegee 70, the second conductive paste 51 is applied to positions on the front surface patterns 21.

Note that the predetermined positions of the front surface patterns 21 where the first conductive paste 41 is applied are positions that face the first conductive paste 41 filled in the first via holes 11 when constituting a laminated body 90 which will be described later. Similarly, the predetermined positions of the front surface patterns 21 where the second conductive paste 51 is applied are positions that face the second conductive paste 51 filled in the second via holes 12 when constituting the laminated body 90 described later.

Further, since the first and the second electrically conductive pastes 41, 51 are constituted using terpene having the melting point at room temperature as the organic solvent, the organic solvent is evaporated while being applied, and the first and the second electrically conductive pastes 41, 51 will not nearly flow after being applied. Therefore, by appropriately adjusting the through holes 62*a*, 63*a* of the masks 62, 63, it is possible to suppress the first and the second conductive pastes 41, 51 applied to the front surface patterns 21 from wettedly spreading and being mixed together.

Further, in the present embodiment, the through holes 62*a*, 63*a* are formed in cylindrical shapes having larger diameters than the first and the second via holes 11, 12. That is, the first and the second conductive pastes 41, 51 applied onto the front surface patterns 21 and the back patterns 31 are applied so as to overflow from positions that face the first and the second electrically conductive pastes 41, 51 filled in the first and the second via holes 11, when constituting the laminated body 90 described later.

Figure 3:
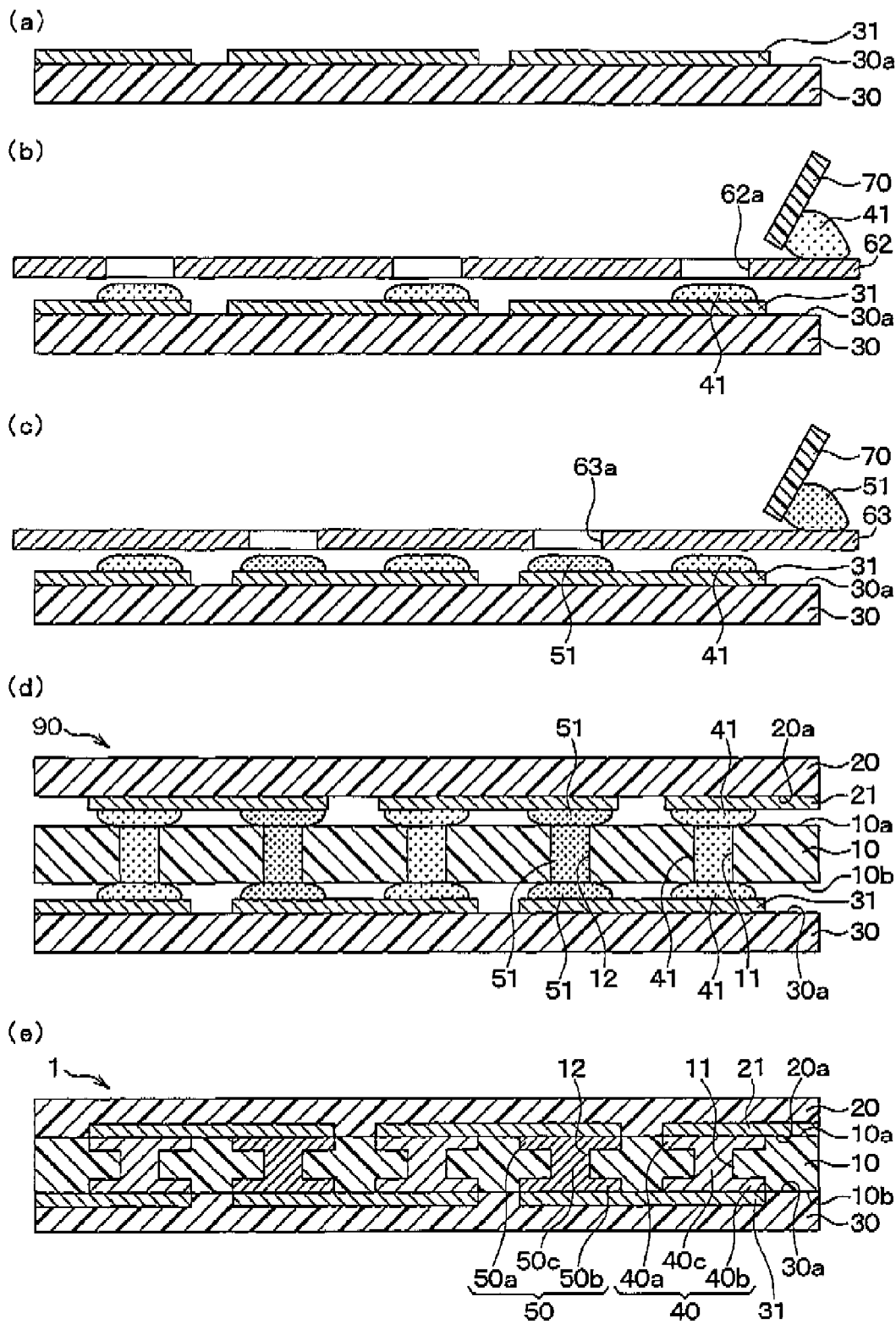
FIGS. 3(a)-3(e) show a sectional view of a manufacturing process of the thermoelectric converter following FIGS. 2(a)-2(f)

Further, as shown in FIG. 3(*a*) to FIG. 3(*c*), one with the first and the second conductive pastes 41, 51 applied on predetermined positions of the back surface pattern 31 is prepared by performing the same processes as FIG. 2 (*d*) to FIG. 2(*f*).

Thereafter, as shown in FIG. 3(*d*), the laminated body 90 is constituted by laminating the back surface protective member 30, the insulating substrate 10, and the front surface protective member 20 in this order. Specifically, the front surface protecting member 20 is disposed on the front surface 10*a* side of the insulating substrate 10 such that the first conductive pastes 41 applied on the front surface patterns 21 and the first conductive pastes 41 filled in the first via holes 11 are in contact. Further, the front surface protecting member 20 is disposed such that the second conductive pastes 51 applied on the front surface patterns 21 and the second conductive pastes 51 filled in the second via holes 12 are in contact. Furthermore, the back surface protecting member 30 is disposed on the back surface 10*b* side of the insulating substrate 10 such that the first conductive pastes 41 applied on the back surface patterns 31 and the first conductive pastes 41 filled in the first via holes 11 are in contact. Moreover, the back surface protecting member 30 is disposed such that the second conductive pastes 51 applied on the back surface patterns 31 and the second conductive pastes 51 filled in the second via holes 12 are in contact. Thus, the laminated body 90 of which the first and the second conductive pastes 41, 51 are disposed between the first and the second conductive pastes 41, 51 filled in the first and the second via hole 11, 12 and the front surface patterns 21, and the first and the second conductive pastes 41, 51 are disposed between the first and the second conductive pastes 41, 51 filled in the first and the second via hole 11, 12 and the back surface patterns 31 is constituted.

Subsequently, as shown in FIG. 3(*e*), an integration process that integrates the laminated body 90 by disposing the laminated body 90 between a pair of pressing plates (not shown), and applying pressure from top and bottom in a laminating direction while heating in a vacuum state to the laminated body is performed.

At this time, the first and second interlayer connection members 40, 50 are constituted by sintered metal compound (sIntered alloy) that maintains the crystal structure of the plurality of metal atoms before sintering by the powder alloy contained in the first and the second conductive pastes 41, 51 being pressed and solid-phase sintered. Specifically, the first end portions 40*a*, 50*a* of the first and the second interlayer connection members 40, 50 are formed from the first and the second conductive pastes 41, 51 applied onto the front surface patterns 21. Further, the second end portions 40*b*, 50*b* of the first and the second interlayer connection members 40, 50 are formed from the first and the second conductive pastes 41, applied onto the back surface patterns 31. Furthermore, the intermediate portions 40*c*, 50*c* of the first and the second interlayer connection members 40, 50 are formed from the first and the second conductive pastes so 41, 51 filled in the first and the second via holes 11, 12. Then, since the first end portions 40*a*, 50*a*, the second end portions 40*b*, 50*b*, and the intermediate portions 40*c*, 50*c* are also integrated, the first and the second interlayer connection members 40, 50 having the I-shaped cross sections are constituted.

Further, in the integration process, the alloy powder constituting the first and the second interlayer connection members 40, 50 and the front surface patterns 21 and the back surface pattern 31 are press-contacted, and the first and the second interlayer connection members 40, 50 and the front surface patterns 21 and the back surface pattern 31 are also connected.

Note that although not particularly limited, when integrating the laminated body 90, a cushioning material such as rock wool paper may be disposed between the laminated body 90 and each of the pressing plates.

As described above, in the present embodiment, the first and the second conductive pastes 41, 51 constituting the intermediate portions 40*c*, 50*c* are disposed in the first and the second via holes 11, 12 of the insulating substrate 10. Further, the first and the second conductive pastes 41, 51 constituting the first end portions 40*a*, 50*a* are disposed on the front surface patterns 21, and the first and the second conductive pastes 41, 51 constituting the second end portions 40*b*, 50*b* are disposed on the back surface patterns 31. Then, by constituting the laminated body 90 by laminating the back surface protective member 30, the insulating substrate 10, and the front surface protective member 20 in this order, and by integrating them, the thermoelectric converter 1 is constituted.

Therefore, the thermoelectric converter 1 having the first and the second interlayer connection members 40, 50 of the above configuration can be easily manufactured by appropriately changing the diameters of the first and the second via holes 11, 12, the applied amount of the first and the second conductive pastes 41, 51 disposed on the front surface patterns 21 and the back surface patterns 31, or conditions when integrating the laminated body 90.

Although an example containing the powder of Bi—Sb—Te alloy as the first conductive paste 41 and one containing the powder of Bi—Te alloy as the second conductive paste 51 has been described in the present embodiment, the powder alloys are not limited thereto. For example, the alloy powders configuring the first and second conductive pastes 41, 51 may be appropriately selected from alloys that are obtained by alloying copper, constantan, chromel, alumel, and the like, with iron, nickel, chrome, copper, silicon, and the like. Alternatively, the alloy powders may be appropriately selected from alloys of tellurium, bismuth, antimony or selenium, or alloys of silicon, iron or aluminum.

Second Embodiment

A second embodiment of the present invention will be described. In contrast to the manufacturing method of the first embodiment, in the present embodiment, the first and the second conductive pastes 41, 51 are applied on the front surface 10a and the back surface 10b of the insulating substrate 10, and the rest of the configuration, which is similar to the first embodiment, is omitted from the description here.

As shown in FIG. 4(a), in the present embodiment, after the processes of FIG. 2(a) to FIG. 2(c) have been performed, the first conductive paste 41 is further applied on the first conductive paste 41 filled in the first via hole 11 on the front surface 10a of the insulating substrate 10.

Next, as shown in FIG. 4(b), the second conductive paste 51 is further applied on the second conductive paste 51 filled in the second via hole 12 on the front surface 10a of the insulating substrate 10.

Note that the process of FIG. 4(a) can be performed by the printing method using the mask 62 and the squeegee 70 described in the processes shown in FIGS. 2 (e) and 3 (b). Similarly, the process of FIG. 4(b) can be performed by the printing method using the mask 63 and the squeegee 70 described in the processes shown in FIGS. 2 (f) and 3 (c). Moreover, even in the present embodiment, the through holes 62a, 63a are formed in the cylindrical shapes having larger diameters than the first and the second via holes 11, 12. That is, in the processes of FIG. 4(a) and FIG. 4(b), the first and the second conductive pastes 41, 51 are applied so as to overflow also to positions located around the first and the second via holes 11, 12 at the front surface 10a of the insulating substrate 10.

Next, as shown in FIG. 4(c), a supporting base 100 formed with through holes 100a at positions corresponding to the first and the second via holes 11, 12 is prepared. Then, the insulating substrate 10 is fixed to the supporting base 100 so that the first and the second conductive pastes 41, 51 raised from the front surface 10a of the insulating substrate 10 are accommodated in the through holes 100. Then, the first conductive paste 41 is further applied on the first conductive paste 41 filled in the first via hole 11 in the back surface 10b of the insulating substrate 10.

Subsequently, as shown in FIG. 4(d), the second conductive paste 51 is further applied on the second conductive paste 51 filled in the second via hole 12 in the back surface 10b of the insulating substrate 10.

Note that the processes of FIG. 4(c) and FIG. 4(d) can be performed similarly by the printing method using the masks 62, 63 and the squeegee 70 in the processes of FIGS. 4 (a) and 4 (b). That is, even in the processes of FIG. 4(c) and FIG. 4(d), the first and the second conductive pastes 41, 51 are applied so as to overflow also to positions located around the first and the second via holes 11, 12 at the back surface 10b of the insulating substrate 10.

Thereafter, as shown in FIG. 4(e), the laminated body 90 is constituted. Specifically, the front surface protective member 20 is disposed on the front surface 10a of the insulating substrate 10 such that the first and the second conductive pastes 41, 51 further applied on the first and the second conductive pastes 41, 51 filled in the so first and the second via holes 11, 12 and the front surface patterns 21 are in contact. Further, the back surface protective member 30 is disposed on the back surface 10b of the insulating substrate 10 such that the first and the second conductive pastes 41, 51 further applied on the first and the second conductive pastes 41, 51 filled in the first and the second via holes 11, 12 and the back surface patterns 31 are in contact.

Thereafter, although not particularly shown, the same processes as FIG. 3(e) mentioned above are performed. Thereby, the first and the second end portions 40a, 40b, 50a, 50b are formed from the first and the second conductive pastes 41, 51 applied on the first and the second conductive pastes 41, 51 filled in the first and the second via holes 11, 12, and the intermediate portions 40c, 50c are formed from the first and the second conductive pastes 41, 51 filled in the first and the second via holes 11, 12, thus the thermoelectric converter 1 is manufactured.

Accordingly, it is possible to obtain the same effect as in the first embodiment even further applying the first and the second conductive pastes 41, 51 on the first and the second conductive pastes 41, 51 filled in the first and the second via holes 11, 12 in the front surface 10a and back surface 10b of the insulating substrate 10.

Third Embodiment

A third embodiment of the present invention will be described. In contrast to the manufacturing method of the second embodiment, in the present embodiment, after integrating the insulating substrate 10 and the front surface protective member 20, they are integrate with the back surface protective member 30, and the rest of the configuration, which is similar to the second embodiment, is omitted from the description here.

Figure 5:
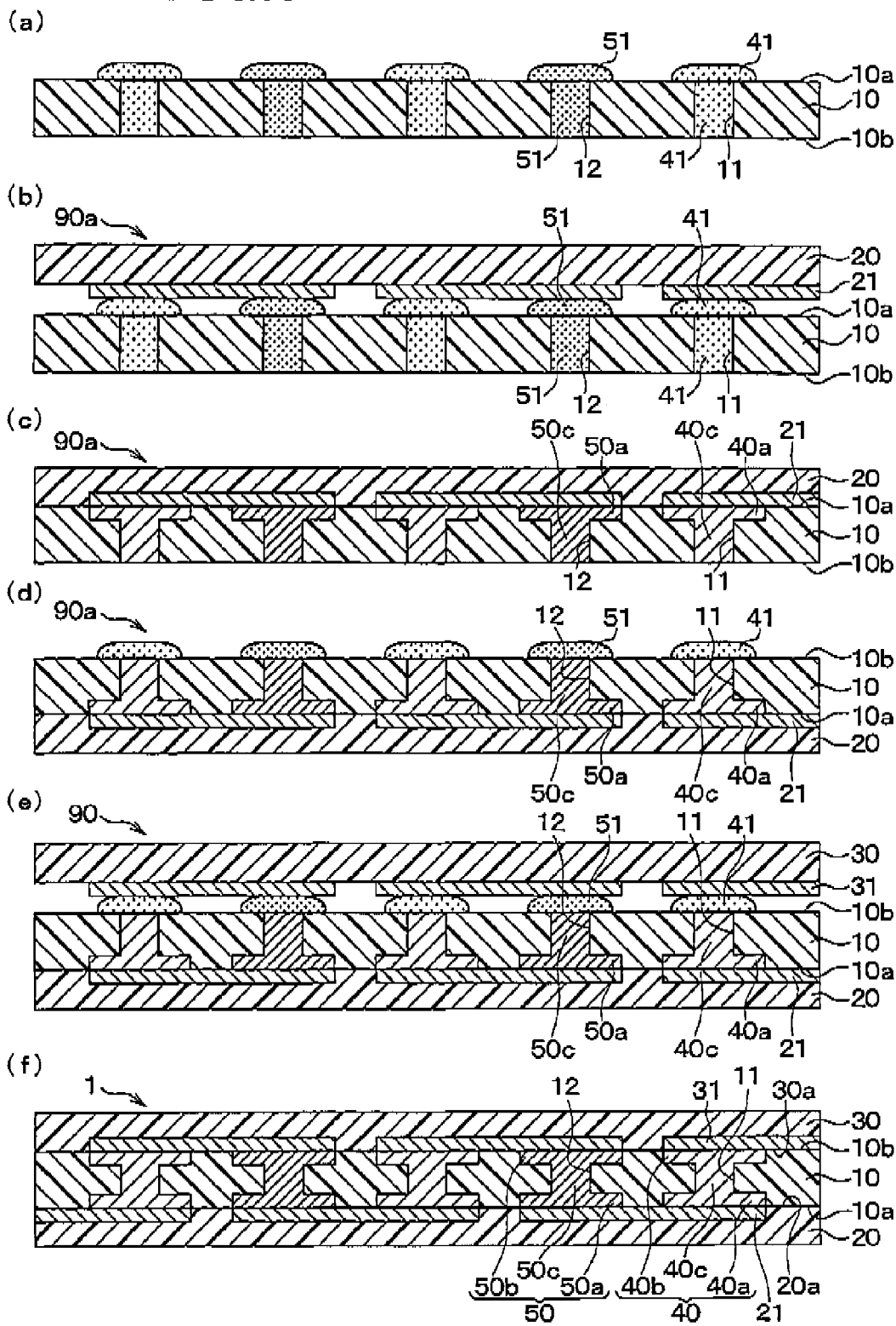
FIGS. 5(a)-5(f) show a sectional view of a manufacturing process of the thermoelectric converter according to a third embodiment of the present invention.

In the present embodiment, first, as shown in FIG. 5(a), one with the processes up to FIG. 4(b) has been performed is prepared.

Then, as shown in FIG. 5(b), an intermediate constituent body 90a is constituted by disposing the front surface protecting member 20 on the front surface 10a m side of the insulating substrate 10. Specifically, the front surface protective member 20 is disposed on the front surface 10a of the insulating substrate 10 such that the first and the second conductive pastes 41, 51 further applied on the first and the second conductive pastes 41, 51 filled in the first and the second via holes 11, 12 and the front surface patterns 21 are in contact.

Thereafter, as shown in FIG. 5(c), an integration process that integrates the intermediate constituent body 90a by applying pressure from top and bottom in a laminating direction while heating in a vacuum state is performed. At this time, the first end portions 40a, 40b are formed from the first and the second conductive pastes 41, 51 applied on the first and the second conductive pastes 41, 51 filled in the first and the second via holes 11, 12. Further, the intermediate portions 40c, 50c are formed from the first and the second conductive pastes 41, 51 filled in the first and the second via holes 11, 12. That is, in the present embodiment, the first end portions 40a, 40b and the intermediate portions 40c, 50c in the first and the second interlayer connection members 40, 50 are formed first.

Next, as shown in FIG. 5(d), the first and the second conductive pastes 41, 42 are further applied on the intermediate portions 40c, 50c disposed in the first and the second via holes 11, 12 in the back surface 10b of the insulating substrate 10.

Note that although this process may be performed similarly to the processes in FIG. 4(c) and FIG. 4(d) mentioned above, since the front surface protective member 20 is already disposed on the front surface 10a of the insulating substrate 10, the supporting base 100 is not required.

Then, as shown in FIG. 5(e), the laminated body 90 is constituted by disposing the back surface protective member 30 on the back surface 10b side of the insulating substrate 10. Specifically, the back surface protective member 30 is disposed on the back surface 10b of the insulating substrate 10 such that the first and the second conductive pastes 41, 51 further applied on the intermediate portions 40c, 50c disposed in the first and the second via holes 11, 12 and the back surface patterns 31 are in contact.

Next, as shown in FIG. 5(f), an integration process that integrates the laminated body 90 by applying pressure from top and bottom in the laminating direction while heating in a vacuum state is performed. At this time, the second end portions 40b, 50b of the first and the second interlayer connection members 40, 50 are formed from the first and the second conductive pastes 41, 51 that are further applied on the intermediate portions 40c, 50c disposed in the first and the second via holes 11, 12.

Accordingly, it is also possible to obtain the same effect as in the first embodiment after integrating the insulating substrate 10 and the front surface protective member 20, and forming the first end portions 40a, 50a and the intermediate portion 40c, 50c, and then integrating them with the back surface protective member 30 and forming the second end portions 40b, 50b.

Other Embodiments

The present invention is not limited to the embodiments described above, and can be appropriately modified within a scope not departing from the scope of the present invention.

For example, in the above embodiment, the adsorption paper 80 may not be used when filling the first and the second conductive pastes 41, 51 into the first and the second via holes 11, 12.

Further, in each of the above embodiments, when applying the first and the second conductive pastes 41, 51, they may be formed by plating or the like rather than the printing method.

Then, in each of the above embodiments, an organic solvent such as paraffin having a melting point of 43 degrees C. may be used as an organic solvent contained in the first and the second conductive pastes 41, 51, for example. Note that in a case of using such an organic solvent, it is preferable not to flow the first and the second conductive pastes 41, 51 by evaporating the organic solvent after performing the processes of FIG. 2(e) and FIG. 2(f), and FIG. 3(b) and FIG. 3(c) or the like, for example. In other words, it is preferable to suppress the first and the second conductive pastes 41, 51 from being mixed by evaporating the organic solvent.

Further, in the first embodiment, the diameters of the 113 through holes 62a, 63a may be smaller than the first and the second via holes 11, 12. That is, the first and the second conductive pastes 41, 51 applied on the front surface patterns 21 and the back surface patterns 31 may be applied only to inside of positions facing the first and the second conductive pastes 41, 51 filled in the first and the second via holes 11, 12 when constituting the laminated body 90. In such a case, it is sufficient to form the first and the second interlayer connection members 40, 50 of which the sectional areas of the first end portions 40a, 50a and the second end portions 40b, 50b are configured larger than the sectional areas of the intermediate portions 40c, 50c in the sectional areas in the direction parallel to the plane direction of the insulating substrate 10 by appropriately controlling the applying amount of the first and the second conductive pastes 41, 51 or the conditions when integrating the laminated body 90.

Similarly, in the second and third embodiments, the diameters of the through holes 62a, 63a may be smaller than the first and the second via holes 11, 12.

Further, in the first embodiment, the intermediate portions 40c, 50c may be formed by sintering the first and the second conductive pastes 41, 51 in advance after performing the process of FIG. 2(c). Moreover, one with the intermediate portions 40c, 50c of the first and the second interlayer connection members 40, 50 embedded in the insulating substrate 10 may be prepared. Furthermore, the first and the second conductive pastes 41, applied onto the front surface patterns 21 may be sintered after the process of FIG. 2(f). That is, ones with the first end portions 40a, 50a of the first and the second interlayer connection members 40, 50 formed on the front surface patterns 21 may be prepared. Similarly, the first and the second conductive pastes 41, 51 applied onto the back surface patterns 31 may be sintered after the process of FIG. 3(c). That is, ones with the second end portions 40b, 50b of the first and the second interlayer connection members 40, 50 formed on the back surface patterns 31 may be prepared.

Then, when constituting the laminated body 90 in the process of FIG. 3(d), the intermediate portion 40c, 50c may be disposed on the insulating substrate member 10, the first end portions 40a, 50a may be disposed between the middle portions 40c, 50c and the front surface patterns 21, and the second end portions 40b, 50b may be disposed between the intermediate portions 40c, 50c and the back surface patterns 31. Even when such a laminated body 90 is constituted, the thermoelectric converter 1 of the above configuration is manufactured by the first end portions 40a, 50a and the intermediate portions 40e, 50c being connected, and the second end portions 40b, 50b and the intermediate portions 40c, 50c being connected when the laminated body 90 is being integrated in the process of FIG. 3 (e).

Note that when constituting the laminated body 90, not all of the first and the second conductive pastes 41, 51 are sintered, but only parts of the first and the second conductive pastes 41, 51 may be sintered. For example, when constituting the laminated body 90, it is sufficient that only the first and the second conductive pastes 41, 51 filled in the first and the second via holes 11, 12 are sintered to form the intermediate portions 40c, 50c, and the combination can be appropriately changed.

Similarly, in the second embodiment, when constituting the laminated body 90, parts of the first and the second conductive pastes 41, 51 may be sintered. Furthermore, in the third embodiment, when constituting the intermediate constituent body 90a and laminated body 90, parts of the first and the second conductive pastes 41, 51 may be sintered.

Further, in each of the above embodiments, the second interlayer connection members 50 may be constituted by metal particles such as Ag—Sn system. That is, the second interlayer connection members 50 may be formed for the purpose of achieving electrical conduction, rather than in order to secure the effect of the thermoelectric conversion primarily. In this case, each of the first interlayer connection members 40 may be connected in parallel via the second interlayer connection members 50 by suitably changing the positions where the first and the second via holes 11, 12 are disposed, and by suitably changing the shapes of the front surface patterns 21 and the back surface patterns 31.

Furthermore, since the thermoelectric conversion occur when two different types of metals are connected, only the first via hole 11 may be formed in the insulating substrate member 10, and only the first interlayer connection members 40 may be disposed in the first via hole 11 in the each of the above embodiments. That is, it is also possible to apply the present invention to a thermoelectric converter in which only a single type of interlayer connection members are disposed in the insulating substrate member 10.

REFERENCE SIGNS LIST

1: thermoelectric converter
10: insulating substrate
10a: front surface
10b: back surface
20: front surface protective member
21: front surface pattern
30: back surface protective member
31: back surface pattern
40, 50: the first and the second interlayer connection member (thermoelectric conversion element)
40a, 50a: first end portion
40b, 50b: second end portion
40c, 50c: intermediate portion

The invention claimed is:

1. A method for manufacturing a thermoelectric converter that has an insulated substrate to which a plurality of thermoelectric conversion elements are disposed;
   a surface protecting member disposed on a front surface of the insulating substrate and formed with front surface patterns that are electrically connected to predetermined thermoelectric conversion elements; and
   a back protective member disposed on a back surface opposite to the front surface of the insulating substrate and formed with back surface patterns that are electrically connected to the predetermined thermoelectric conversion elements; wherein,
   each of the thermoelectric conversion elements has a first end portion connected to the front surface pattern, a second end portion connected to the back surface pattern, and an intermediate portion that connects the first end portion and the second end portion; and
   the thermoelectric conversion element of which sectional areas of the first and the second end portions in a direction parallel to a plane direction of the insulating substrate are configured to be larger than sectional areas of intermediate portions, the method comprising:
   a process of preparing the insulating substrate to which a plurality of via holes penetrating through in a thickness direction are formed, and the intermediate portion or a conductive paste constituting the intermediate portion is disposed in the via holes;
   a process of preparing the front surface protective member to which the front surface patterns are formed;
   a process of preparing the back surface protective member to which the back surface patterns are formed;
   a process of constituting a laminated body by disposing the front surface protecting member on the front surface of the insulating substrate and disposing the back surface protective member on the back surface of the insulating substrate; and
   a process of integrating the laminated body; wherein,
   the first end portion or a conductive paste constituting the first end portion is disposed between the intermediate portion or the conductive paste constituting the intermediate portion and the front surface pattern, and the second end portion or a conductive paste constituting the second end portion is disposed between the intermediate portion or the conductive paste constituting the intermediate portion and the back surface pattern to constitute the laminated body in the process of constituting the laminated body; and
   the thermoelectric conversion element having the first and the second end portion and the intermediate portion is formed by applying pressure in a laminating direction while heating to the laminated body in the process of integrating the laminated body.

2. The manufacturing method of the thermoelectric converter according to claim 1, wherein,
   the via holes filled with the conductive pastes are prepared in the process of preparing the insulating substrate;
   the front surface patterns on which the conductive pastes are disposed are prepared in the process of preparing the front surface protective member;
   the back surface patterns on which the conductive pastes are disposed are prepared in the process of preparing the back surface protective member;
   the front surface protective member is disposed on the front surface of the insulating substrate such that the conductive pastes disposed on the front surface patterns and the conductive paste filled in the via holes are in contact in the process of forming the laminated body;
   the back surface protective member is disposed on the back surface of the insulating substrate such that the conductive pastes disposed on the back surface patterns and the conductive paste filled in the via holes are in contact in the process of forming the laminated body; and
   the thermoelectric conversion element having the first end portion, the second end portion, and the intermediate portion is constituted by sintering the conductive paste disposed between the conductive paste filled in the via holes and the front surface patterns, the conductive paste disposed between the conductive paste filled in the via holes and the back surface patterns, and the conductive paste filled in the via holes, and by forming the first end portion from the conductive paste disposed between the conductive paste filled in the via holes and the front surface patterns, the second end portion from the conductive paste disposed between the conductive paste filled in the via holes and the back surface patterns, and the intermediate portion from the conductive paste filled in the via holes in the process of integrating the laminated body.

3. The manufacturing method of the thermoelectric converter according to claim 2, wherein,
   an alloy metal powder in paste form in which a plurality of metal atoms maintain a predetermined crystal structure after an addition of an organic solvent is used as the conductive paste; and a sintered alloy sintered in a state where the plurality of the metal atoms maintain the predetermined crystal structure of the metal atoms is formed as the thermoelectric conversion elements in the process of integrating the laminated body.

4. The manufacturing method of the thermoelectric converter according to claim 1, wherein, the process of preparing the insulating substrate includes a process of filling the conductive paste into the via holes, a process of further disposing the conductive paste on the conductive paste filled in the via holes in the front surface side of the insulating substrate, and a process of further disposing the conductive paste on the conductive paste filled in the via holes in the back surface side of the insulating substrate;

the front surface protective member is disposed on the front surface of the insulating substrate such that the conductive paste further disposed on the conductive paste filled in the via holes and the front surface patterns are in contact, and the back surface protective member is disposed on the back surface of the insulating substrate such that the conductive paste further disposed on the conductive paste filled in the via holes and the back surface patterns are in contact in the process of constituting the laminated body; and the thermoelectric conversion element having the first end portion, the second end portion, and the intermediate portion is constituted by sintering the conductive paste disposed between the conductive paste filled in the via holes and the front surface patterns, the conductive paste disposed between the conductive paste filled in the via holes and the back surface patterns, and the conductive paste filled in the via holes, and by forming the first end portion from the conductive paste disposed between the conductive paste filled in the via holes and the front surface patterns, the second end portion from the conductive paste disposed between the conductive paste filled in the via holes and the back surface patterns, and the intermediate portion from the conductive paste filled in the via holes in the process of integrating the laminated body.

5. The manufacturing method of the thermoelectric converter according to claim 4, wherein, an alloy metal powder in paste form in which a plurality of metal atoms maintain a predetermined crystal structure after an addition of an organic solvent is used as the conductive paste; and a sintered alloy sintered in a state where the plurality of the metal atoms maintain the predetermined crystal structure of the metal atoms is formed as the thermoelectric conversion elements in the process of integrating the laminated body.

6. A method for manufacturing a thermoelectric converter that has an insulated substrate to which a plurality of thermoelectric conversion elements are disposed;

a surface protecting member disposed on a front surface of the insulating substrate and formed with front surface patterns that are electrically connected to predetermined thermoelectric conversion elements; and a back protective member disposed on a back surface opposite to the front surface of the insulating substrate and formed with back surface patterns that are electrically connected to the predetermined thermoelectric conversion elements; wherein, each of the thermoelectric conversion elements has a first end portion connected to the front surface pattern, a second end portion connected to the back surface pattern, and an intermediate portion that connects the first end portion and the second end portion; and the thermoelectric conversion element of which sectional areas of the first and the second end portions in a direction parallel to a plane direction of the insulating substrate are configured to be larger than sectional areas of intermediate portions, the method comprising:

a process of preparing the insulating substrate to which a plurality of via holes penetrating through in a thickness direction are formed, and the intermediate portion or a conductive paste constituting the intermediate portion, is disposed in the via holes;

a process of preparing the front surface protective member to which the front surface patterns are formed;

a process of constituting an intermediate constituent body by disposing the front surface protecting member on the front surface side of the insulating substrate;

a process of integrating the intermediate constituent body;

a process of preparing the back surface protective member to which the back surface patterns are formed;

a process of constituting a laminated body by disposing the back surface protective member on the back surface of the insulating substrate; and a process of integrating the laminated body; wherein, the intermediate constituent body is constituted by disposing the first end portion or the conductive paste constituting the first end portion between the intermediate portion or a conductive paste constituting the intermediate portion and the front surface pattern in the process of constituting the intermediate constituent body;

a part of the thermoelectric conversion element having the first end portion and the intermediate portion is formed by applying pressure in a lamination direction while heating to the intermediate constituent body in the process of integrating the intermediate constituent body;

the second end portion or a conductive paste constituting the second end portion is disposed between the intermediate portion and the back surface pattern to constitute the laminated body in the process of constituting the laminated body; and the thermoelectric conversion element having the first and the second end portion and the intermediate portion is formed by applying pressure in a laminating direction while heating to the laminated body in the process of integrating the laminated body.

* * * * *